United States Patent
Tabata (10) Patent No.: US 10,600,765 B2
(45) Date of Patent: Mar. 24, 2020

(54) SEMICONDUCTOR DEVICE AND METHOD FOR PRODUCING THE SAME

(71) Applicant: Mitsubishi Electric Corporation, Tokyo (JP)

(72) Inventor: Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/153,762

(22) Filed: May 13, 2016

(65) Prior Publication Data

US 2017/0117256 A1  Apr. 27, 2017

(30) Foreign Application Priority Data

Oct. 22, 2015  (JP) ................. 2015-207884

(51) Int. Cl.
*H01L 25/07* (2006.01)
*H01L 23/367* (2006.01)
(Continued)

(52) U.S. Cl.
CPC .......... *H01L 25/072* (2013.01); *H01L 23/367* (2013.01); *H01L 24/43* (2013.01);
(Continued)

(58) Field of Classification Search
CPC ......... H01L 23/49575; H01L 23/49838; H01L 23/49844; H01L 23/528; H01L 23/5286;
(Continued)

(56) References Cited

U.S. PATENT DOCUMENTS 5,471,089 A * 11/1995 Nagatomo .............. H01L 23/50
257/691
5,616,955 A   4/1997 Yamada et al.
(Continued)

FOREIGN PATENT DOCUMENTS

CN    103563075 A    2/2014
JP    H04-072748 A   3/1992
(Continued)

OTHER PUBLICATIONS

An Office Action mailed by the Japanese Patent Office dated Jul. 17, 2018, which corresponds to Japanese Patent Application No. 2015-207884 and is related to U.S. Appl. No. 15/153,762.
(Continued)

*Primary Examiner* — Mark W Tornow
*Assistant Examiner* — Abbigale A Boyle
(74) *Attorney, Agent, or Firm* — Studebaker & Brackett PC (57) ABSTRACT

A technique disclosed in the specification relates to a semiconductor device capable of minimizing restrictions on wire bonding activities and to a method for producing the semiconductor device. The semiconductor device of the present technique includes: a plurality of semiconductor chips disposed on a circuit pattern within a case defined by an outer frame in a plan view; and bonding wires for electrically connecting the semiconductor chips and the circuit pattern together. The semiconductor chips are arranged along a longer-side direction of the case. The bonding wires are strung along the longer-side direction of the case.

8 Claims, 5 Drawing Sheets

(51) Int. Cl.
*H01L 23/373* (2006.01)
*H01L 23/00* (2006.01)

(52) U.S. Cl.
CPC .......... *H01L 24/49* (2013.01); *H01L 23/3736* (2013.01); *H01L 2224/04042* (2013.01); *H01L 2224/05555* (2013.01); *H01L 2224/0603* (2013.01); *H01L 2224/49175* (2013.01); *H01L 2924/00014* (2013.01); *H01L 2924/13055* (2013.01)

(58) Field of Classification Search
CPC ..... H01L 23/5836; H01L 23/50; H01L 24/09; H01L 24/49; H01L 25/07–074; H01L 25/0655; H01L 27/0207; H01L 2224/0612–06179; H01L 2224/49137; H01L 2224/48139; H01L 2224/4911–49113; H01L 2224/49175; H01L 2924/13055; H01L 2924/1203–12038
See application file for complete search history.

(56) References Cited

U.S. PATENT DOCUMENTS

| | | | | |
|---|---|---|---|---|
| 5,761,040 A | * | 6/1998 | Iwasa | H01L 23/49811 257/690 |
| 5,967,858 A | | 10/1999 | Yamada | |
| 8,502,385 B2 | * | 8/2013 | Oka | H01L 21/56 257/170 |
| 2003/0042575 A1 | * | 3/2003 | Takahashi | H01L 24/49 257/577 |
| 2004/0102023 A1 | | 5/2004 | Morozumi et al. | |
| 2005/0218426 A1 | | 10/2005 | Kobayashi et al. | |
| 2006/0220216 A1 | | 10/2006 | Mizuno et al. | |
| 2014/0061673 A1 | * | 3/2014 | Miyanagi | H01L 24/73 257/77 |
| 2014/0246681 A1 | * | 9/2014 | Das | H01L 27/0629 257/77 |
| 2016/0057864 A1 | * | 2/2016 | Matsuyama | H01L 25/072 361/783 |

FOREIGN PATENT DOCUMENTS

| | | |
|---|---|---|
| JP | H07-099275 A | 4/1995 |
| JP | H09-172139 A | 6/1997 |
| JP | H10-173126 A | 6/1998 |
| JP | H10-256411 A | 9/1998 |
| JP | H11-097598 A | 4/1999 |
| JP | 2003-243610 A | 8/2003 |
| JP | 2004-134746 A | 4/2004 |
| JP | 2006-108256 A | 4/2006 |
| JP | 2006-278913 A | 10/2006 |
| JP | 2010-267727 A | 11/2010 |
| JP | 2013-033812 A | 2/2013 |
| JP | 2014-003213 A | 1/2014 |
| JP | 2014-036065 A | 2/2014 |

OTHER PUBLICATIONS

An Office Action mailed by the State Intellectual Property Office of the People's Republic of China dated Oct. 8, 2018, which corresponds to Chinese Patent Application No. 201610921780.2 and is related to U.S. Appl. No. 15/153,762.

An Office Action mailed by the State Intellectual Property Office of the People's Republic of China dated May 20, 2019, which corresponds to Chinese Patent Application No. 201610921780.2 and is related to U.S. Appl. No. 15/153,762.

* cited by examiner

SEMICONDUCTOR DEVICE AND METHOD FOR PRODUCING THE SAME

BACKGROUND OF THE INVENTION

Field of the Invention

A technique disclosed in the specification relates to a semiconductor device and a method for producing the semiconductor device, and relates to a semiconductor device used for various power electronics and a method for producing the semiconductor device, for example.

Description of the Background Art

A semiconductor device basically has a plurality of semiconductor chips within a case that is rectangular in a plan view. The semiconductor device also has a radiating surface for exchanging heat generated by the semiconductor chips with an external radiating means. The radiating surface is insulating. The semiconductor device further has a terminal approximately facing the radiating surface and electrically connected to an external circuit.

The terminal exposed for the electrically connection to the external circuit is guided to the inside of the case as an electrode that includes a conductor. The radiating surface within the case nearby has a conductive plate that is bonded on an insulating substrate made of an insulating material such as ceramic. The conductive plate is separated in part to thus form a circuit pattern.

The semiconductor chips are bonded on the circuit pattern by a bonding means that combines electrical conduction and heat conduction. Moreover, an opposite surface of a bonding surface of each semiconductor chip is electrically connected to the circuit pattern or the electrode with bonding wires.

The circuit pattern on the substrate is made of thin conductive foil as disclosed in Japanese Patent Application Laid-Open No. 2003-243610, for example. In this case, the width of the pattern is approximately nearly half of the entire effective width of the pattern in a narrow direction (i.e., shorter-side direction) of the case in order to feed a main current through the pattern. Approximately two circuit patterns through which the main current flows are disposed in a longer-side direction of the case. Moreover, the bonding wires are strung in the narrow direction (i.e., shorter-side direction) to thus connect the semiconductor chips and the circuit pattern together. A main electrode and the circuit pattern are complicatedly connected together using gaps between the wires.

In a wire bonding apparatus, an arm that performs wire bonding has a limited length due to a mechanical strength of the arm. Furthermore, the arm is geometrically thick in a portion higher (farther) than a bonding point by a certain degree. This thick portion of the arm interferes with a portion such as a periphery of a to-be-bonded object. Hence, wire bonding within a deep and narrow case, for example, involves many restrictions. In particular, a module having a width of approximately 50 mm or less involves such restrictions conspicuously.

One method to avoid such a situation includes completing as much wire bonding as possible before fitting the case into the substrate. Unfortunately, such a method cannot be necessarily used for an electrode disposed in the case.

That is, the electrode in the case may be connected to the circuit pattern before the case is fitted into the substrate. In this case, a force is applied to a bonding portion between the electrode and the circuit pattern when the case is fitted into the substrate, to thus increase possible malfunctions. It is thus hard to choose a vulnerable bonding method such as soldering.

Meanwhile, ultra-sonic (US) bonding, when chosen, is difficult to increase a frequency due to restrictions on the shape of a bonding portion of the electrode. The US bonding, which still needs a large tool (horn), restricts the bonding within the deep and narrow case in terms of arrangement.

SUMMARY OF THE INVENTION

The present technique relates to a semiconductor device capable of minimizing restrictions on wire bonding activities and to a method for producing the semiconductor device.

The semiconductor device according to one aspect of the technique disclosed in the specification includes: a plurality of semiconductor chips provided on a circuit pattern within a case defined by an outer frame in a plan view; bonding wires for electrically connecting the plurality of semiconductor chips and the circuit pattern together; and a main electrode provided within the case. The plurality of semiconductor chips are arranged along a longer-side direction of the case. The bonding wires are strung along the longer-side direction of the case. The main electrode is disposed in the vicinity of one of sides extending in the longer-side direction of the case. The main electrode and the circuit pattern are connected together by ultra-sonic bonding, soldering, or brazing.

The method for producing the semiconductor device according to another aspect of the technique disclosed in the specification, includes bonding, by ultra-sonic bonding, a main electrode onto a circuit pattern within a case defined by an outer frame in a plan view, in the vicinity of one of sides extending in a longer-side direction of the case. The method also includes electrically connecting a plurality of semiconductor chips to the circuit pattern with bonding wires after the bonding of the main electrode. The plurality of semiconductor chips are arranged on the circuit pattern within the case, along the longer-side direction of the case. The bonding wires are strung in the longer-side direction of the case.

According to the one aspect of the technique disclosed in the specification, the semiconductor device minimizes the restrictions on the wire bonding activities within a narrow and deep case. According to the other aspect of the technique disclosed in the specification, the method for producing the semiconductor device minimizes the restrictions on the wire bonding activities within the narrow and deep case. Moreover, a bonding step is done once. This reduces manufacturing costs and shortens a takt time.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments will be described with reference to the accompanying drawings. It is noted that the drawings are merely schematic representations of the invention, and the interrelationships between sizes and positions of individual images shown in the separate drawings are not necessarily provided with accuracy, and can be thus changed as appropriate. It is further noted that throughout the following descriptions, like components are denoted by the same symbols and also have like names and functions. Detailed descriptions of the like components may be thus omitted.

Still further, throughout the following descriptions, the use of terms, such as "top", "under", "side", "bottom", "front", and "back", that indicate specific positions and specific directions is merely for convenience in easy appreciation of the embodiments. These terms thus have nothing to do with actual directions when the embodiments are actually implemented.

<First Preferred Embodiment>

The following describes a semiconductor device and a method for producing the semiconductor device according to a first preferred embodiment. For convenience of description, initially provided is a description about bonding wires strung along a shorter-side direction of an outer frame of a case as disclosed in Japanese Patent Application Laid-Open No. 2003-243610.

Figure 10:
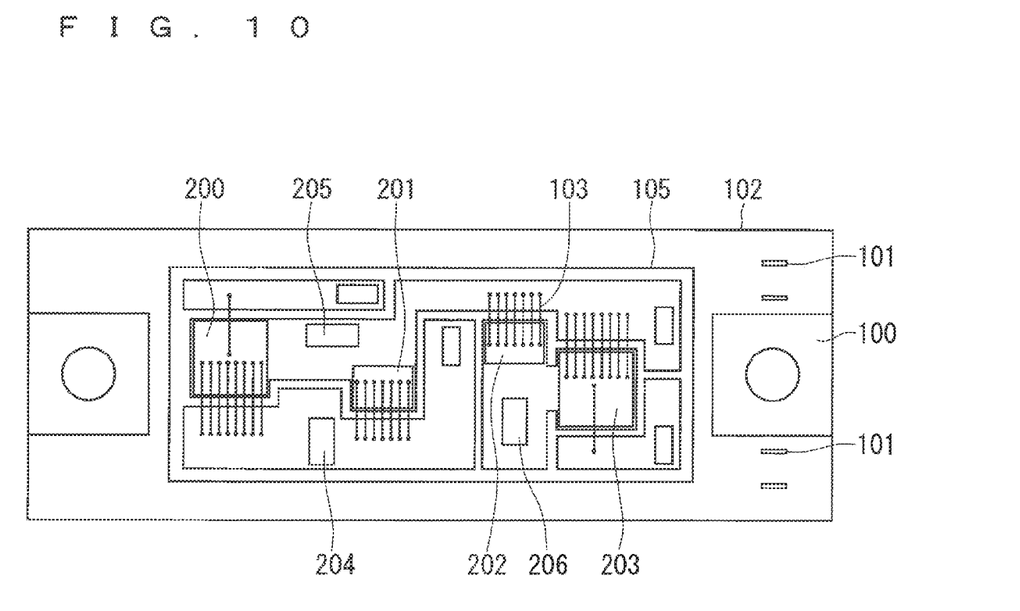
FIG. 10 is a plan view schematically illustrating a configuration for enabling a semiconductor device according to a preferred embodiment.

FIG. 10 is a plan view schematically illustrating a configuration for enabling the semiconductor device according to the present preferred embodiment.

As illustrated in FIG. 10, a semiconductor chip 200, a semiconductor chip 201, a semiconductor chip 202, and a semiconductor chip 203 are disposed within the case defined by an outer frame 102. Moreover, bonding wires 103 for connecting individual semiconductor chips and circuit patterns together are strung along a shorter-side direction of the outer frame 102 of the case. Moreover, a main electrode 204, a main electrode 205, and a main electrode 206 are individually disposed on the circuit patterns. The circuit patterns are formed on an insulating substrate 105. The outer frame 102 of the case is provided with electrodes 100 and signal terminals 101.

<Configuration of Semiconductor Device>

Figure 2:
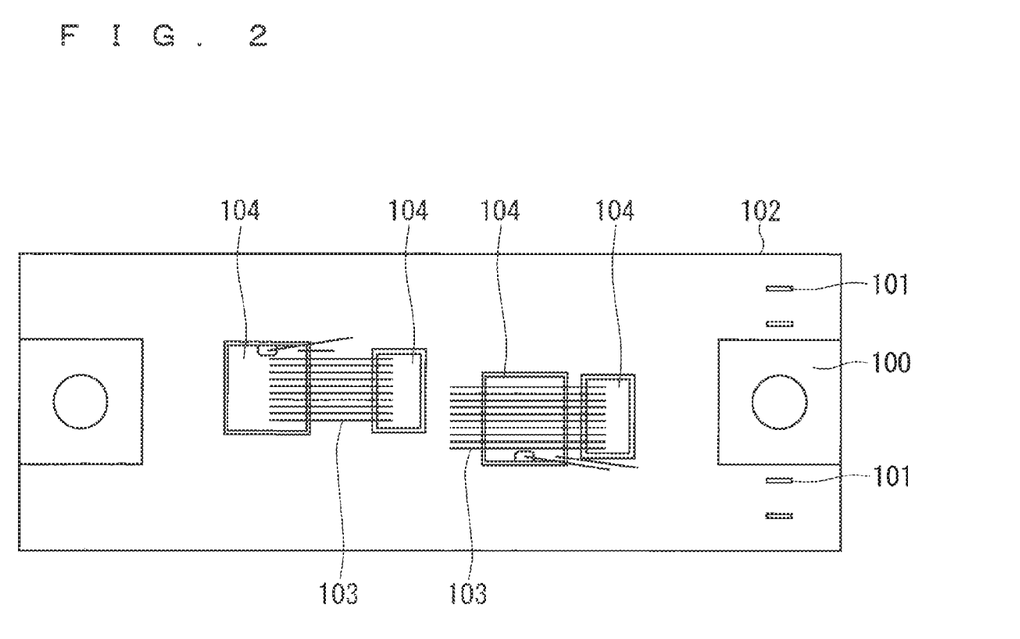
FIG. 2 is a plan view schematically illustrating a configuration for enabling a semiconductor device according to a preferred embodiment.

FIG. 2 is a plan view schematically illustrating a configuration for enabling the semiconductor device according to the present preferred embodiment.

As illustrated in FIG. 2, a plurality of semiconductor chips 104 are disposed on a circuit pattern within the case defined by the outer frame 102 in a plan view. The semiconductor chips 104 are arranged along a longer-side direction of the outer frame 102 of the case. Moreover, bonding wires 103 for connecting the semiconductor chips 104 to the circuit pattern are strung along the longer-side direction of the outer frame 102 of the case. It is noted that an angle formed between a direction in which the bonding wires 103 are strung and the longer-side direction of the outer frame 102 of the case is desirably within approximately 20 degrees. Further, the outer frame 102 of the case is provided with electrodes 100 and signal terminals 101.

Here, the length of the case in its longer-side direction is greater than or equal to twice the length of the case in its shorter-side direction. Moreover, the length of the case in its shorter-side direction is approximately 50 mm or less.

All bonding wires 103 are strung along the longer-side direction of the outer frame 102 of the case in the above structure. This structure enables bonding activities only in a longer-side direction that is the most freely movable in a narrow and deep case. This facilitates bonding the semiconductor chips and circuit pattern within the case together after the case is fitted in a substrate. Furthermore, this facilitates bonding the electrodes in the outer frame 102 of the case and the circuit pattern within the case together.

Here, to enable the above configuration, the circuit pattern needs to be formed from the semiconductor chips 104 through the electrodes in the outer frame 102 of the case. Unfortunately, feeding a large current requires a certain width of the pattern proportionate to the large current. A large width of the pattern, however, proportionately increases intervals between the semiconductor chips 104. As a result, a module is long in its longer-side direction, to thus limit current values.

Accordingly, a "thick-copper" substrate can be used to form the circuit pattern. The thick-copper substrate is made of conductive foil including copper foil with a thickness of approximately 0.4 mm or greater.

The use of the thick-copper substrate increases the cross-sectional area of the pattern per width of the pattern. Consequently, a large current would flow through a pattern having a small width, if any, and a current would freely flow in a narrow direction of the pattern, if any.

Such a configuration enables the wires to be attached on a narrow pattern in a vertical direction, i.e., on a side surface of the circuit pattern with respect to the wire bonding for electrically connecting the semiconductor chips 104 and the circuit pattern together. As a result, the wires are short, or intervals of the wire bonding are short. This reduces restrictions on implementing the wire bonding for the semiconductor chips 104 approximately linearly.

<Second Preferred Embodiment>

The following describes a semiconductor device and a method for producing the semiconductor device according to a second preferred embodiment. Any components similar to those described in the previous preferred embodiment are denoted by the same symbols, and detailed descriptions of the like components are omitted as necessary.

<Configuration of Semiconductor Device>

Figure 3:
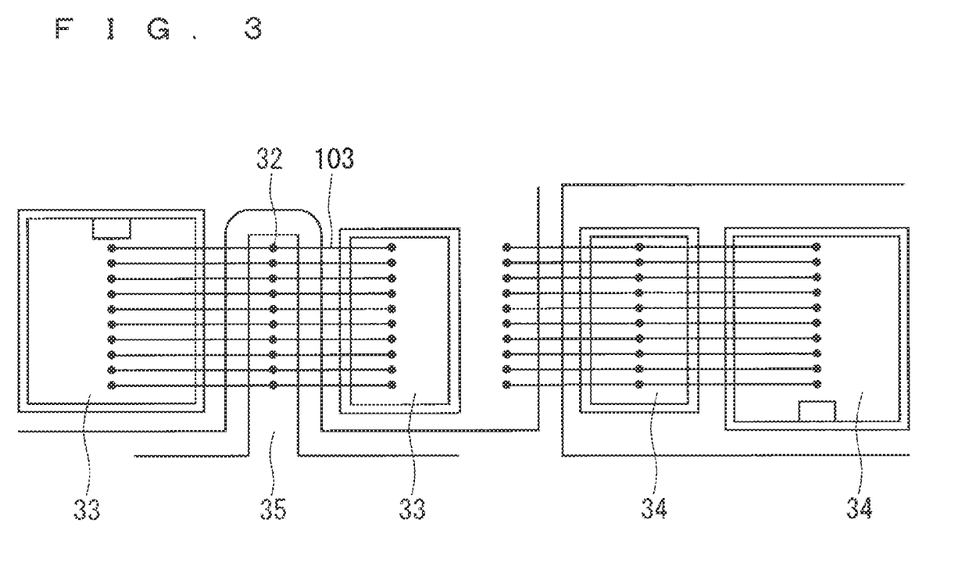
FIG. 3 is a plan view schematically illustrating a structure of a semiconductor chip and its periphery within a case in a configuration for enabling a semiconductor device according to a preferred embodiment.

FIG. 3 is a plan view schematically illustrating a configuration for enabling the semiconductor device according to the present preferred embodiment.

As illustrated in FIG. 3, a plurality of semiconductor chips are disposed on a circuit pattern within a case.

As illustrated in FIG. 3, bonding wires 103 from an emitter of an insulated gate bipolar transistor (IGBT) semiconductor chip and bonding wires 103 from an anode of a diode chip are connected to a common circuit pattern. However, separate connections of the individual wires consume a large area of the pattern, i.e., increase in footprint of the pattern. This is unfavorable in terms of miniaturization and manufacturing costs of devices.

Here, the use of the previously-discussed thick-copper substrate enables a current to freely flow in a narrow direction of the pattern. Accordingly, provided is a narrow via-circuit pattern 35 interposed between these two semiconductor chips in a plan view, to thus connect the bonding wires 103 from the emitter of the IGBT semiconductor chip and the bonding wires 103 from the anode of the diode chip together at bonding points 32.

Meanwhile, two complex elements each including the IGBT semiconductor chip and the diode chip may be disposed within the case. Such a case (e.g., a series connection, a collector common, an emitter common, or an AC switch) can produce wastes in providing the circuit pattern in order to connect these two complex elements. To eliminate these wastes, one of the elements, i.e., a complex element 33 is configured such that the two semiconductor chips are connected to a reverse parallel diode via the narrow via-circuit pattern 35. The other, i.e., a complex element 34 is configured such that the two semiconductor chips are connected to the reverse parallel diode without via the narrow via-circuit pattern 35.

This method is taken for the following reason. For example, paths in the circuit pattern are long because intervals between the two IGBT semiconductor chips increase, or emitters of the two IGBT semiconductor chips face each other, when both complex elements are connected in reverse parallel via the via-circuit pattern or without via the via-circuit pattern.

<Third Preferred Embodiment>

The following describes a semiconductor device and a method for producing the semiconductor device according to a third preferred embodiment. Any components similar to those described in the previous preferred embodiments are denoted by the same symbols, and detailed descriptions of the like components are omitted as necessary.

<Configuration of Semiconductor Device>

Figure 4:
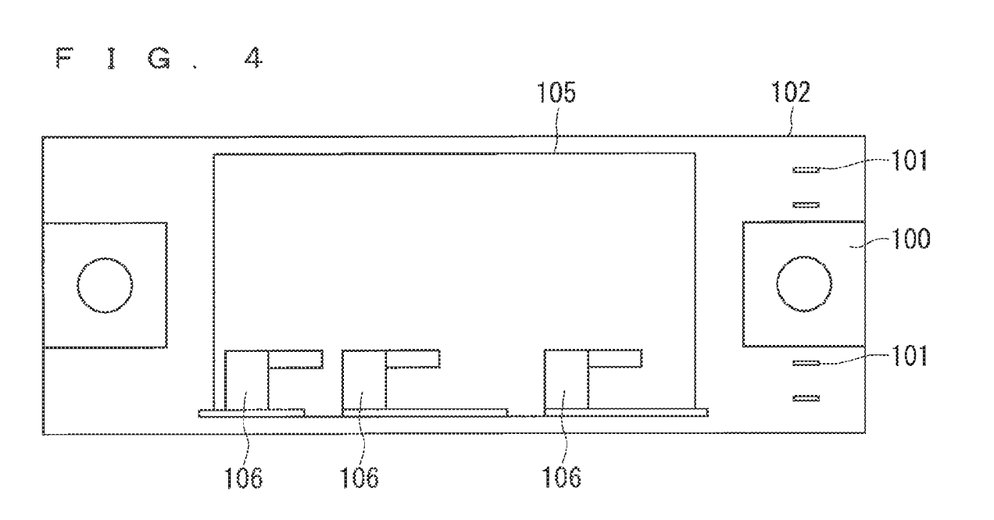
FIG. 4 is a plan view schematically illustrating a configuration for enabling a semiconductor device according to a preferred embodiment.

FIG. 4 is a plan view schematically illustrating a configuration for enabling the semiconductor device according to the present preferred embodiment.

As illustrated in FIG. 4, an insulating substrate 105 is disposed within a case defined by an outer frame 102. Moreover, a plurality of main electrodes 106 are disposed on the insulating substrate 105. It is noted that semiconductor chips 104 are omitted in the drawing for simplification.

In a typical module having a small width, bonding portions between individual terminals of the main electrodes 106 and a circuit pattern on the insulating substrate 105 have been dispersedly positioned or have been positioned on both sides of the module, in order to enhance pattern area efficiency of the bonding portions between the individual main electrodes 106 and the circuit or to enhance a heat dissipation property. Such positioning unfortunately has strengthened inductance, increased costs for electrodes, and further rendered designs for eliminating problems including mutual induction with signal lines complicated.

Accordingly, the use of the previously-described thick-copper substrate expects thermal diffusion using the circuit pattern. Hence, the heat dissipation property is enhanced by allocating a sufficient pattern area.

Further, a relatively-small thick-copper substrate with a card size (e.g., 85.60 mm×53.98 mm) does not have many options on the size of the substrate whose manufacturing cost is reduced. Such a card-sized substrate thus does not have many advantages in the above-discussed typical positioning. Accordingly, a thermal diffusion means is rather considered to be an area of the pattern obtained by bonding the terminals of the main electrodes 106 and the circuit pattern together not by the wire bonding but by another method, such as US bonding, soldering, or brazing. The thermal diffusion means is also rather considered to be an invalid area obtained by gathering, in the vicinity of one side extending in a longer-side direction of the case, the bonding portions between the terminals of the main electrodes 106 and the circuit pattern. Consequently, the inductance is weaken by purposely gathering the bonding portions between the terminals of the main electrodes 106 and the circuit pattern in the vicinity of the one side extending in the longer-side direction of the case, and further by concentrating the electrodes that are magnetic flux sources to thus have high magnetic resistance. Moreover, the mutual induction is reduced by increasing the distance from the signal line. Here, the vicinity of the one side extending in the longer-side direction of the case is a range within approximately one thirds of one side extending in a shorter-side direction of the case, for example.

As many semiconductor chips as possible need to be disposed along the bonding portions between the terminals of the main electrodes 106 and the circuit pattern in order for the bonding portions to effectively serve as a heat dissipation means. Hence, the case is desirably slender.

<Fourth Preferred Embodiment>

The following describes a semiconductor device and a method for producing the semiconductor device according to a fourth preferred embodiment. Any components similar to those described in the previous preferred embodiments are denoted by the same symbols, and detailed descriptions of the like components are omitted as necessary.

<Configuration of Semiconductor Device>

Figure 5:
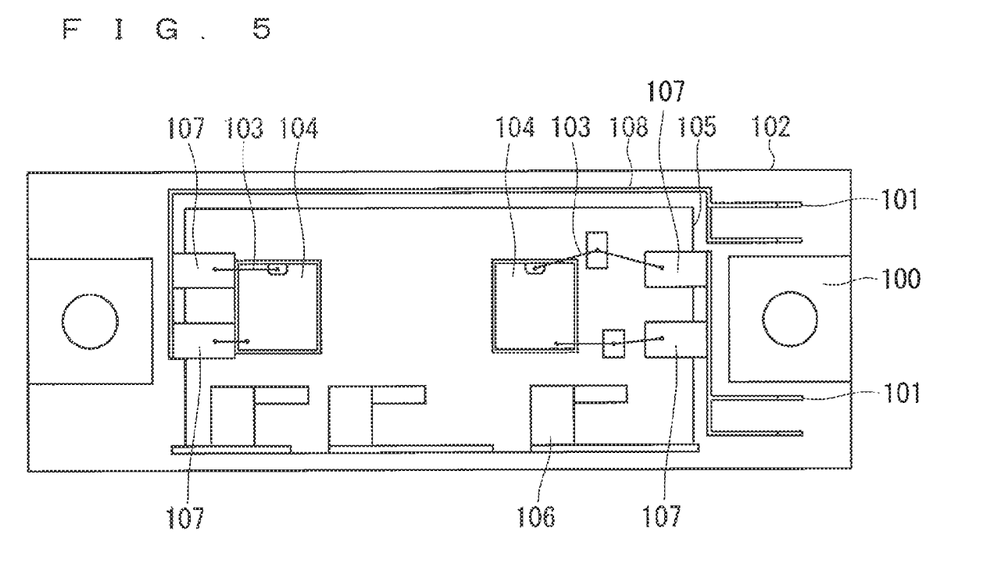
FIG. 5 is a plan view schematically illustrating a configuration for enabling a semiconductor device according to a preferred embodiment.

FIG. 5 is a plan view schematically illustrating a configuration for enabling the semiconductor device according to the present preferred embodiment.

As illustrated in FIG. 5, an insulating substrate 105 is disposed within a case defined by an outer frame 102. Moreover, a plurality of main electrodes 106 are disposed on the insulating substrate 105.

Moreover, a plurality of semiconductor chips 104 are disposed on the insulating substrate 105. Further, a plurality of signal electrodes 107 are disposed on the insulating substrate 105. Each of the semiconductor chips 104 are bonded to the corresponding signal electrode 107. Moreover, each of the signal electrodes 107 is individually disposed in the vicinity of sides extending in a shorter-side direction of the outer frame 102 of the case, and is electrically connected to a corresponding signal terminal 101 through a signal wire 108. The signal terminals 101 are disposed on one side of the outer frame 102 extending in the shorter-side direction of the case. Here, the vicinity of the side extending in the shorter-side direction of the case is a range within approximately one thirds of one side extending in a longer-side direction of the case, for example.

When the signal wires 108 receive mutual induction from a main circuit, there is possibly a problem such as feedback.

To avoid such a problem, the signal electrodes 107 have been electrically connected to the circuit pattern in a position as close to the signal terminals 101 as possible conventionally. Unfortunately, when the case is rectangular shaped in a plan view, one of IGBT semiconductor chips is positioned away from the signal terminals 101. As a result, one of the signal wires 108 between the IGBT semiconductor chip away from the signal terminals 101 and the signal terminals 101 passes through a region having dense circuit structures. This has resulted in complicated design and prevented achieving ideal positioning.

Another method includes positioning the signal terminals per se in the distance. However, such a method has merely shifted problems to external wires. Fundamental solutions to the problems have been thus left behind in many cases.

The structure according to the present preferred embodiment is configured such that terminals of the main electrodes 106 are concentrated on only one side of the longer sides of the case. Hence, the other side, which is opposite the one side where the terminals of the main electrodes 106 are disposed, is hard to receive the mutual induction. Accordingly, one of the signal wires 108 is disposed in the vicinity of the other side, which is opposite the one side where the terminals of the main electrodes 106 are disposed. Note that the one of the signal wires 108 is between the signal electrodes 107 away from the signal terminals 101 and the signal terminals 101. Such positioning of the signal wire 108 makes it hard to receive the mutual induction from the terminals of the main electrodes 106, and the positioning further achieves wiring for avoiding the region of the dense circuit structures.

It is noted that individual connections may be established directly on the semiconductor chips 104, and may be established via the circuit pattern or a different semiconductor chip.

Further, the structure according to the present preferred embodiment, when combined with the structure illustrated in FIG. 2 or FIG. 3, is configured such that signal electrodes of two complex elements are disposed on the shorter sides of the case opposite each other. Such positioning yields linearity of wire bonding including the wire bonding between the complex elements and the signal electrodes. Moreover, endpoints of the wire bonding are positioned close to the center in the longer-side direction of the case.

Such positioning reduces the mutual induction to the signal wire 108 between the complex element and the signal terminal.

<Fifth Preferred Embodiment>

The following describes a semiconductor device and a method for producing the semiconductor device according to a fifth preferred embodiment. Any components similar to those described in the previous preferred embodiments are denoted by the same symbols, and detailed descriptions of the like components are omitted as necessary.

<Configuration of Semiconductor Device>

Figure 6:
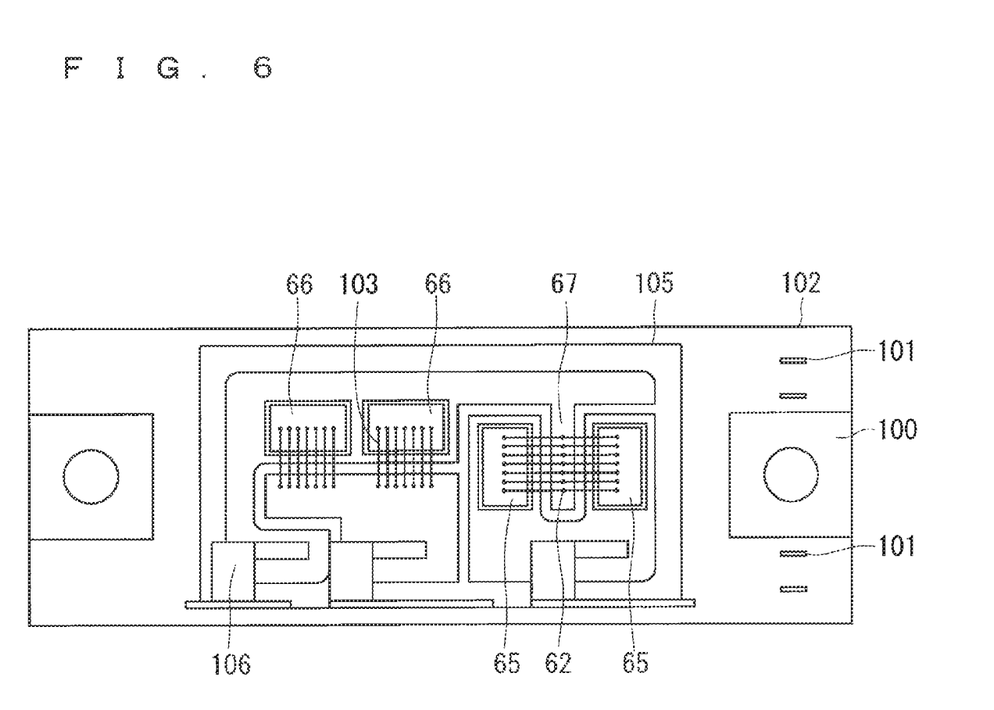
FIG. 6 is a plan view schematically illustrating a configuration for enabling a semiconductor device according to a preferred embodiment.

FIG. 6 is a plan view schematically illustrating a configuration for enabling the semiconductor device according to the present preferred embodiment.

As illustrated in FIG. 6, an insulating substrate 105 is disposed within a case defined by an outer frame 102. Moreover, a plurality of main electrodes 106 are disposed on the insulating substrate 105.

Moreover, a complex element 65 and a complex element 66 are disposed on the insulating substrate 105.

An IGBT semiconductor chip in an IGBT module and a reverse parallel diode chip are not simultaneously energized. However, these chips are simultaneously energized when the IGBT semiconductor chip is replaced with the diode chip to thus form two parallel chips of diode.

In this case, when one of wire bonding may be established via a different semiconductor chip, a double current flows through a via-portion. As a result, much wire bonding is required, and some sizes of the diode chip can prevent a sufficient amount of bonding wires from being formed. Unfortunately, connecting each diode chip to a circuit pattern independently consumes an area of the pattern considerably. This is thus disadvantageous in terms of sizes and manufacturing costs of cases.

Here, the use of the previously-described thick-copper substrate enables a current to freely flow in a narrow pattern direction. Accordingly, a narrow via-circuit pattern 67 is provided, where the via-circuit pattern is interposed between two semiconductor chips in a plan view. This establishes a connection between bonding wires 103 from an emitter of the IGBT semiconductor chip and bonding wires 103 from an anode of the diode chip at bonding points 62 via the via-circuit pattern 67.

Placing two complex elements can unfortunately produce wastes in providing the circuit pattern for connecting the two complex elements. To eliminate these wastes, one of the complex elements, i.e., the complex element 65 is configured such that the two semiconductor chips are connected to a parallel diode via the narrow via-circuit pattern 67. The other, i.e., the complex element 66 is configured such that the two semiconductor chips are connected to the parallel diode without via the narrow via-circuit pattern 67.

<Sixth Preferred Embodiment>

The following describes a semiconductor device and a method for producing the semiconductor device according to a sixth preferred embodiment. Any components similar to those described in the previous preferred embodiments are denoted by the same symbols, and detailed descriptions of the like components are omitted as necessary.

<Configuration of Semiconductor Device>

Figure 7:
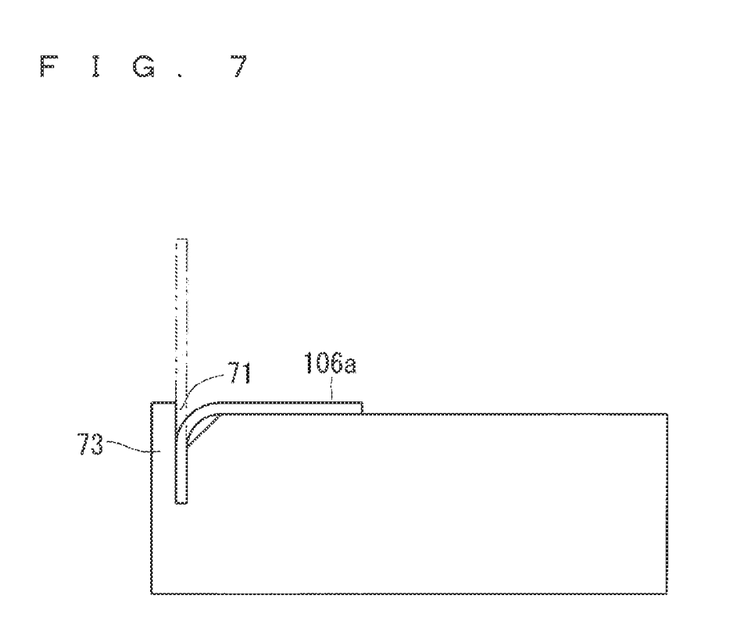
FIG. 7 is a cross-sectional view schematically illustrating a structure near a bent portion of a main electrode according to a preferred embodiment.

FIG. 7 is a cross-sectional view schematically illustrating a structure near a bent portion of a main electrode. A dotted-lined portion in FIG. 7 illustrates the main electrode before undergoing bending.

As illustrated in FIG. 7, an edge of a main electrode 106a, in part, extends from a recessed portion 71 in the top surface of a case 73. Moreover, the main electrode 106a has a terminal bent in a direction away from an outer frame of the case 73 in the recessed portion 71 of the top surface of the case 73, i.e., in an inward direction of the case 73 in a plan view. Here, the recessed portion 71 has a C-plane in the inward direction in which the main electrode 106a is bent. The recessed portion 71 further has a gap in an outward direction opposite the inward direction in which the main electrode 106a is bent when the main electrode 106a is disposed to be bent.

The main electrode 106a may be bent after being bonded on a circuit pattern. In an effort to allocate the inner space of a module as broad as possible in such a structure, the main electrode 106a before undergoing bending desirably has the terminal disposed as close to the outer frame as possible. Unfortunately, a creepage distance can be insufficient when the terminal of the main electrode 106a is close to the outer frame.

Accordingly, in the present preferred embodiment, a bend, R, of the terminal of the main electrode 106a is set to be relatively large, and the terminal of the main electrode 106a is bent in a recessed position on the top surface of the case. Such a structure would allocate a sufficient creepage distance between an outer frame 102 and the terminal of the bent main electrode 106a if the terminal of the main electrode 106a before undergoing bending is disposed close to the outer frame 102.

It is noted that when the plurality of main electrodes are formed as illustrated in FIG. 6, for example, distances between bent portions of the main electrodes and the outer frame of the case adjacent to the bent portions are approximately equal without consideration of variations in processing accuracy.

<Seventh Preferred Embodiment>

The following describes a semiconductor device and a method for producing the semiconductor device according to a seventh preferred embodiment. Any components similar to those described in the previous preferred embodiments are denoted by the same symbols, and detailed descriptions of the like components are omitted as necessary.

<Configuration of Semiconductor Device>

Figure 8:
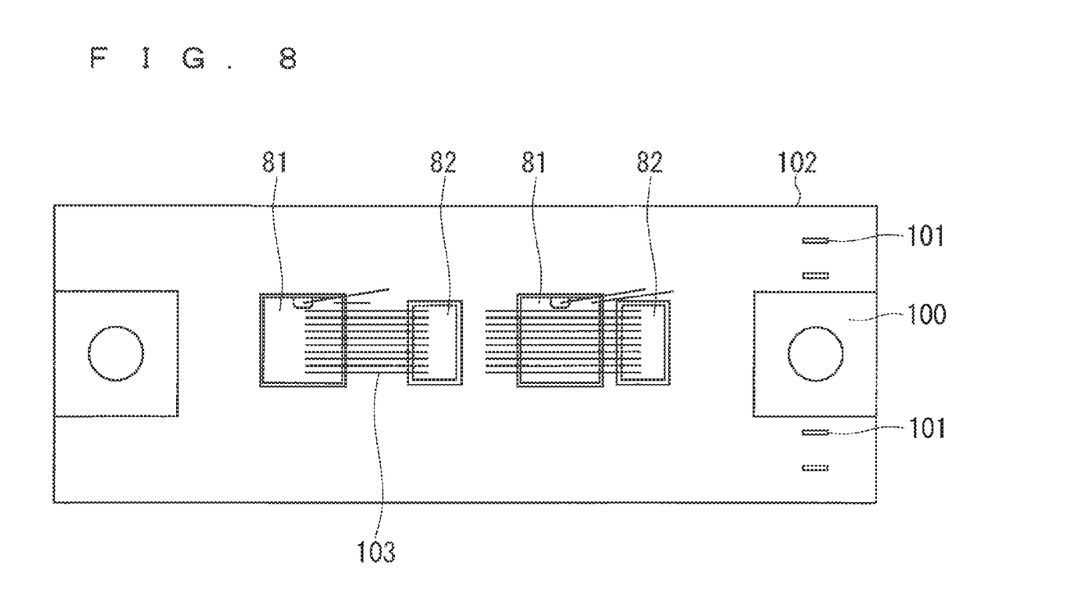
FIG. 8 is a plan view schematically illustrating a configuration for enabling a semiconductor device according to a preferred embodiment.

FIG. 8 is a plan view schematically illustrating a configuration for enabling the semiconductor device according to the present preferred embodiment.

As illustrated in FIG. 8, semiconductor chips 81 and semiconductor chips 82 are disposed within a case defined by an outer frame 102.

A wire-bonding time in a takt time of a step is considerably consumed relative to depreciation costs of wire bonding apparatuses.

Further, products in various wire-bonding forms may be manufactured in multiple plants in parallel. In such a case, complicated wiring of bonding wires makes an apparatus stop time during a wire bonding program prolonged, thus affecting initial costs. Moreover, complicated wire bonding makes initial verifications complicated, thus easily incurring extra costs due to returning to missing designs.

According to the present preferred embodiment, an angle between a direction in which semiconductor chips 81 of the same kind are arranged and a direction in which bonding wires 103 in the semiconductor chips 81 are strung is within 20 degrees. Moreover, an angle between a direction in which semiconductor chips 82 of the same kind are arranged and a direction in which bonding wires 103 in the semiconductor chips 82 are strung is within 20 degrees. This configuration provides wire bonding having high symmetry, continuity and periodicity, to thus solve the above-described problems.

<Eighth Preferred Embodiment>

The following describes a semiconductor device and a method for producing the semiconductor device according to an eighth preferred embodiment. Any components similar to those described in the previous preferred embodiments are denoted by the same symbols, and detailed descriptions of the like components are omitted as necessary.

<Configuration of Semiconductor Device>

Figure 9:
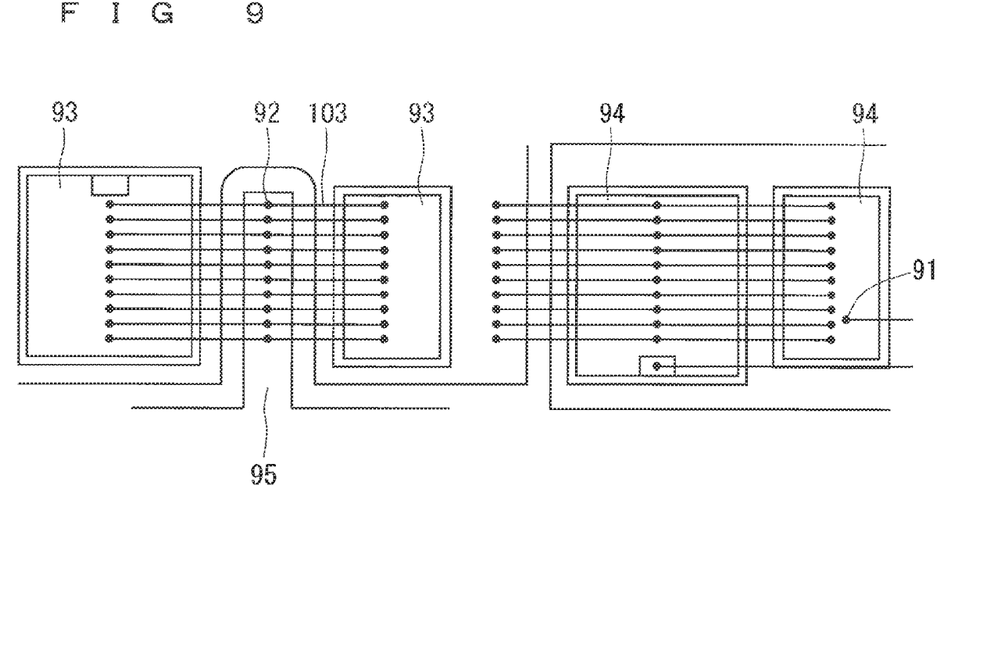
FIG. 9 is a plan view schematically illustrating a structure of a semiconductor chip and its periphery within a case in a configuration for enabling a semiconductor device according to a preferred embodiment.

FIG. 9 is a plan view schematically illustrating a structure of a semiconductor chip and its periphery within a case in a configuration for enabling the semiconductor device according to the present preferred embodiment. FIG. 9 shows only a signal wire 108 for a complex element 94 and omits a signal wire 108 for a complex element 93.

Bonding wires 103 from an emitter of an IGBT semiconductor chip are long when connected to a circuit pattern via a diode chip. As a result, the number of bonding wires needs to increase to address heat generation. This is disadvantageous in terms of processing times and manufacturing costs. Unfortunately, wire connections of a driving emitter are tight when the bonding wires 103 from the emitter of the IGBT semiconductor chip is connected to the circuit pattern without via the diode chip.

Accordingly, in the present preferred embodiment, a complex element 93 and a complex element 94 each include the IGBT semiconductor chip and the diode chip. The complex element 94 is provided without via a via-circuit pattern 95. In the complex element 94, an emitter drive line that is a driving potential reference 91 of the IGBT semiconductor chip is connected to the circuit pattern or to a signal electrode via the diode chip.

<Ninth Preferred Embodiment>

The following describes a semiconductor device and a method for producing the semiconductor device according to a ninth preferred embodiment.

In a general method, as much wire bonding as possible is established during the absence of a physical obstacle, such as a case or an electrode. A main electrode is subsequently bonded by US bonding, followed by electrical connection between a signal electrode of the case and a circuit pattern on an insulating substrate together with bonding wires.

This method requires wire bonding before and after the US bonding and thus requires a wire bonding step twice. However, tools used for the US bonding are large. It is thus difficult to bond the signal electrode onto the circuit pattern by the US bonding for a module whose inner space is narrow. Hence, cutting the wire bonding step in the second time by connecting the signal electrode in the US bonding step produces a great obstacle in design.

Accordingly, all electrodes are bonded by the US bonding without implementing any wire bonding for connecting semiconductor chips and the circuit pattern together. Subsequently, wire bonding for connecting the semiconductor chips and the circuit pattern together is implemented.

<Tenth Preferred Embodiment>

The following describes a semiconductor device and a method for producing the semiconductor device according to a tenth preferred embodiment.

The use of the thick-copper substrate results in an excessively high likelihood of energization of a current. A typical Si semiconductor chip device thus cannot use its advantages sufficiently under restrictions imposed by heat loss and heat dissipation. Accordingly, a semiconductor chip that includes a wide band gap semiconductor is used.

Examples of the wide band gap semiconductor include silicon carbide (SiC), gallium nitride (GaN), diamond (C), $Ga_2O_3$, AlN, $C_3N_4$, $Si_3N_4$, $Ge_3N_4$, $Sn_3N_4$, $Al_4C_3$, $Ga_4C_3$, and GeC. Here, a wide band gap semiconductor is typically a semiconductor having a band gap of approximately 2 eV or greater. Examples of the wide band gap semiconductor include a group III nitride such as gallium nitride (GaN), a group II oxide such as zinc oxide (ZnO), a group II chalcogenide such as zinc selenide (ZnSe), diamond, and silicon carbide.

A switching device that includes a wide band gap semiconductor typically has a lower amount of heat loss per unit area than a switching device that includes a Si semiconductor. Consequently, the restrictions imposed by the heat loss and heat dissipation would be loosened if the thick-copper substrate is used.

<Eleventh Preferred Embodiment>

The following describes a semiconductor device and a method for producing the semiconductor device according to an eleventh preferred embodiment. Any components similar to those described in the previous preferred embodiments are denoted by the same symbols, and detailed descriptions of the like components are omitted as necessary.

<Configuration of Semiconductor Device>

Figure 1:
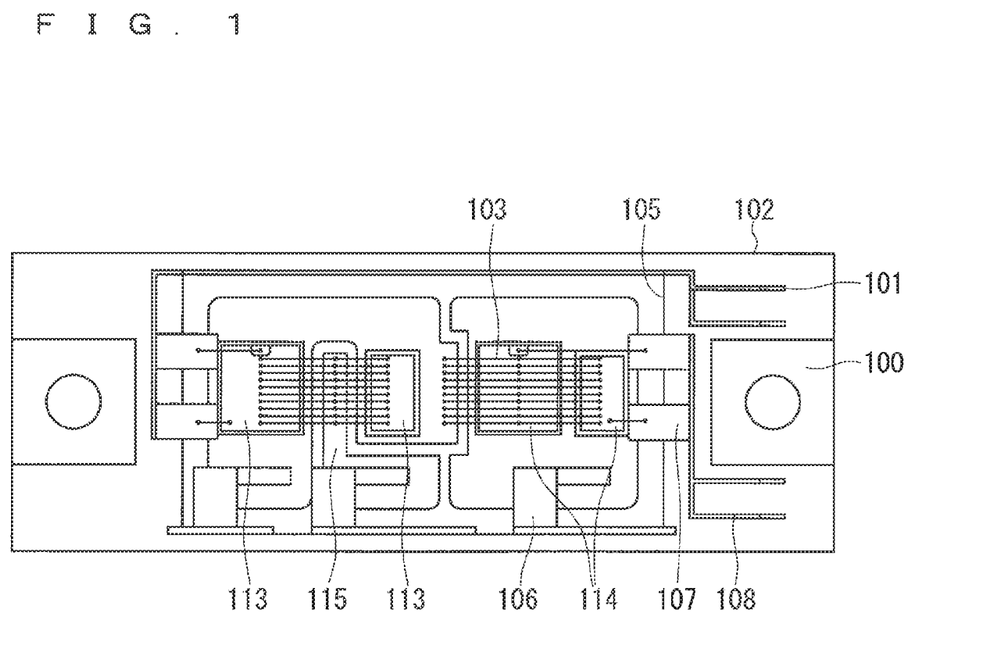
FIG. 1 is a plan view schematically illustrating a configuration for enabling a semiconductor device according to a preferred embodiment.

FIG. 1 is a plan view schematically illustrating a configuration for enabling the semiconductor device according to the present preferred embodiment. FIG. 1 illustrates the previously-described components of the individual preferred embodiment in combination.

As illustrated in FIG. 1, an insulating substrate 105 is disposed within a case defined by an outer frame 102. Moreover, a complex element 113 and a complex element 114 are disposed on the insulating substrate 105. Moreover, bonding wires 103 for connecting each of the complex elements to the circuit pattern are strung along a longer-side direction of the outer frame 102 of the case.

Moreover, the outer frame 102 of the case is provided with electrodes 100 and signal terminals 101.

Further, the use of the thick-copper substrate enables a current to freely flow in a narrow pattern direction. Accordingly, a narrow via-circuit pattern 115 is provided between individual semiconductor chips of the complex element 113. This establishes a connection between bonding wires 103 from an emitter of the IGBT semiconductor chip and bonding wires 103 from an anode of a diode chip via the via-circuit pattern 115.

Further, a plurality of main electrodes 106 are disposed on the insulating substrate 105. The main electrodes 106 are concentrated in the vicinity of one side extending in the longer-side direction of the outer frame 102 of the case.

Further, a plurality of signal electrodes 107 are disposed on the insulating substrate 105. The signal electrodes 107 are each individually disposed in the vicinity of sides extending in a shorter-side direction of the outer frame 102 of the case, and are each electrically connected to the individual signal terminals 101 through signal wires 108. Here, one of the signal wires 108 is disposed in the vicinity of a side opposite the one side where terminals of the main electrodes 106 are disposed, where the signal wire 108 extends between some of the signal electrodes 107 positioned away from the signal terminals 101 and the signal terminals 101.

<Effects of the Preferred Embodiments>

The following illustrates effects of the above-described preferred embodiments. These effects are based on specific configurations that are illustrated in the above-described preferred embodiments. Moreover, to an extent that like effects are obtained, these specific configurations may be replaced with different specific embodiments that are illustrated in the specification. Further, the replacement may be done over multiple preferred embodiments. That is, combinations of the individual configurations, which are illustrated in the different preferred embodiments, may bring like effects.

According to the above-described preferred embodiments, the semiconductor device includes the plurality of semiconductor chips 104 and the bonding wires 103. Moreover, the semiconductor chips 104 are disposed on the circuit pattern within the case defined by the outer frame 102 in the plan view. The bonding wires 103 are used to electrically connect the semiconductor chips 104 and the circuit pattern together. The semiconductor chips 104 are arranged along the longer-side direction of the case. The bonding wires 103 are strung along the longer-side direction of the case.

Such configurations minimize restrictions on wire bonding activities within the narrow and deep case.

Different configurations illustrated in the specification other than the above configurations may be omitted as necessary. That is, the above configurations alone bring the above-described effect. However, the above configurations may additionally include at least one of the different configurations illustrated in the specification as necessary. That is, the above configurations may additionally include the different configurations illustrated in the specification, which are excluded from these configurations. Such an additionally-included configuration still brings the above-described effect similarly.

Further, according to the above-described preferred embodiments, the circuit pattern is made of copper foil with the thickness of 0.4 mm or greater. Such a configuration increases the cross-sectional area of the pattern per pattern width. Consequently, the large current would flow in the narrow pattern width and the current would freely flow in the narrow pattern direction.

Still further, according to the above-described preferred embodiments, the semiconductor device includes two first complex elements in which the two of the semiconductor chips are connected in reverse parallel. Here, the complex element 33 and the complex element 34 correspond to the two first complex elements. Moreover, one of the first complex elements, i.e., the complex element 33 is configured such that the two semiconductor chips are connected in reverse parallel via the first via-circuit pattern interposed between the two semiconductor chips in the plan view. Here, the via-circuit pattern 35 corresponds to the first via-circuit pattern. The other first complex element, i.e., the complex element 34 is configured such that the two semiconductor chips are connected directly in reverse parallel without via the via-circuit pattern 35. Such a configuration reduces the wastes in providing the circuit pattern for connecting the two complex elements, and minimizes the sizes and manufacturing costs of the cases.

Yet further, according to the above-described preferred embodiments, the semiconductor device includes the signal electrodes disposed within the case and electrically connected to the individual semiconductor chips 104. Moreover, the other one of the two first complex elements includes the IGBT semiconductor chip and the diode chip. Here, the complex element 93 and the complex element 94 correspond to the first complex elements. Moreover, the complex element 94 corresponds to the other first complex element. Moreover, the driving potential reference 91 of the IGBT semiconductor chip is connected to the circuit pattern or to the signal electrodes via the diode chip. In such a configuration, the bonding wires 103 from the emitter of the IGBT semiconductor chip are not long. This eliminates a need to increase the number of bonding wires in order to address the heat generation. Consequently, the processing times and manufacturing costs are reduced.

Still yet further, according to the above-described preferred embodiments, the semiconductor device includes two second complex elements in which the two of the semiconductor chips, which are the diode chips, are connected in parallel. Here, the complex element 65 and the complex element 66 correspond to the second complex elements. Moreover, one of the two second complex elements, i.e., the complex element 65 is configured such that the two semiconductor chips are connected in parallel via the second via-circuit pattern. Here, the via-circuit pattern 67 corresponds to the second via-circuit pattern. Moreover, the other one of the two second complex elements, i.e., the complex element 66 is configured such that the two semiconductor chips are connected directly in parallel without via the second via-circuit pattern. Such a configuration reduces the wastes in providing the circuit pattern for connecting the two complex elements, and minimizes the sizes and manufacturing costs of the cases.

Still further, according to the above-described preferred embodiments, the plurality of semiconductor chips 104 each include a wide band gap semiconductor. A switching device that includes a wide band gap semiconductor typically has a lower amount of heat loss per unit area than a switching device that includes a Si semiconductor. Consequently, the restrictions imposed by the heat loss and heat dissipation would be loosened if the thick-copper substrate is used.

Yet further, according to the above-described preferred embodiments, the semiconductor device includes the main electrodes 106 within the case. The main electrodes 106 are disposed in the vicinity of the one side extending in the longer-side direction of the case. Moreover, the main electrodes 106 and the circuit pattern are connected together by the ultra-sonic bonding, soldering, or brazing. Such a configuration enables the inductance to be weakened by concentrating the electrodes, which are magnetic flux sources, in the vicinity of the one side to thus have the high magnetic resistance. Moreover, the configuration reduces the manufacturing costs of the electrodes. Moreover, the configuration facilitates designs for eliminating problems including the mutual induction with the signal wires 108.

Still yet further, according to the above-described preferred embodiments, the semiconductor device includes the plurality of signal electrodes 107 and the signal terminals 101 electrically connected to the signal electrodes 107. Moreover, the plurality of signal electrodes 107 are disposed within the case and are electrically connected to the individual semiconductor chips 104. Moreover, the signal electrodes 107 are individually disposed in the vicinity of the side extending in the shorter-side direction of the case. Moreover, the signal terminals 101 are disposed on the one side of the outer frame 102 extending in the shorter-side direction of the case. Moreover, the signal wire 108 for connecting the signal electrodes 107 and the signal terminals 101 together passes near the other side extending in the longer-side direction of the case. Note that the signal electrodes 107 are disposed in the vicinity of the side extending in the shorter-side direction of the case, the side being opposite the one side of the outer frame 102 where said signal terminals 101 are disposed. Also note that the other side is opposite the one side extending in the longer-side direction of the case where the main electrodes 106 are disposed. In such a configuration, the signal wire 108 is hard to be affected by the mutual induction of the main electrodes 106. Moreover, such a configuration enables the signal wires to be disposed on the circuit pattern, away from other circuits.

Still further, according to the above-described preferred embodiments, the case has a recessed portion 71 on the top surface of the case. Moreover, the edge of the main electrode 106a is exposed from the recessed portion 71 and is bent in the inward direction of the case in the plan view. Such a structure would allocate the sufficient creepage distance between the outer frame 102 and the terminal of the bent main electrode 106a if the terminal of the main electrode 106a before undergoing bending is disposed close to the outer frame 102.

Yet further, according to the above-described preferred embodiments, the plurality of semiconductor chips, each of which is the same kind, are arranged along the longer-side direction of the case. Moreover, the angle between the direction in which the plurality of semiconductor chips are arranged and the direction in which the bonding wires 103 in the semiconductor chips are strung is within 20 degrees. Such a structure provides the wire bonding having high symmetry, continuity and periodicity, to thus reduce the manufacturing costs.

Still yet further, according to the above-described preferred embodiments, a method for producing the semiconductor device includes bonding, by ultra-sonic bonding, the main electrodes 106 onto the circuit pattern within the case defined by the outer frame in the plan view, in the vicinity of the one of the sides extending in the longer-side direction of the case. The method also includes electrically connecting the plurality of semiconductor chips 104 to the circuit pattern with the bonding wires 103 after the bonding of the main electrodes 106. Note that the plurality of semiconductor chips 104 are arranged on the circuit pattern within the case, along the longer-side direction of the case. Also note that the bonding wires 103 are strung in the longer-side direction of the case.

Such a configuration minimizes the restrictions on the wire bonding activities within the narrow and deep case. Moreover, the bonding step is done once in this configuration. This reduces the manufacturing costs and shortens the takt time.

Different configurations illustrated in the specification other than the above configurations may be omitted as necessary. That is, the above configurations alone bring the above-described effect. However, the above configurations may additionally include at least one of the other configurations illustrated in the specification as necessary. That is, the above configurations may additionally include the other configurations, which are excluded from these configurations, illustrated in the specification. Such an additionally-included configurations also bring the above-described effect similarly.

<Variations of the Preferred Embodiments>

The material quality, material, size, or shape of each component, the positons of components relative to each other, or a condition for implementation described in each of the preferred embodiments is in all aspects illustrative and does not limit the present invention. Thus, numerous variations not shown can be assumed within the range of the technique disclosed in the specification. Examples of the variations include modification, addition and omission of at least one component. Further example includes extraction of at least one component from at least one of the preferred embodiments and combination of the extracted component with another component of a different preferred embodiment.

Further, unless otherwise contradicted, "one" component described in each of the preferred embodiments may include "one or more" components. Additionally, individual components are conceptual units. One component may include multiple structures, one component may correspond to a part of some structure, and multiple components may be included in one structure. Each component includes a structure of a different configuration or a different shape as long as the structure of the different configuration or the different shape achieves the same function.

Still further, the descriptions in the specification are referred for any purposes of the present technique. It is thus not an admission that any of the descriptions provided herein are conventional techniques.

Yet further, if the above-described preferred embodiments contain descriptions about materials without being particularly specified, it is to be understood that an example of these materials includes alloys containing other additives in these materials unless otherwise contradicted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a plurality of semiconductor chips provided on a circuit pattern within a case defined by an outer frame in a plan view, said case having a longer side extending along a longer-side direction and a shorter side that is shorter than said longer side and extends along a shorter-side direction that is transverse to the longer-side direction and within the same plane as the longer-side direction;
bonding wires for electrically connecting said plurality of semiconductor chips and said circuit pattern together;
a plurality of main electrodes provided within said case and disposed to extend along the longer-side direction of said case; and
two complex elements, each of said complex elements including two of said plurality of semiconductor chips connected to each other,
wherein one of said two complex elements is configured such that said two of said plurality of semiconductor chips are connected by a plurality of the bonding wires via a via-circuit pattern provided on a place interposed between said two of said plurality of semiconductor chips in a plan view, and
wherein another one of said two complex elements is configured such that said two of said plurality of semiconductor chips of said another one of said two complex elements are connected directly by another plurality of the bonding wires,
wherein each said main electrode is disposed proximate to an edge of said longer side extending in the longer-side direction of said case and spaced away from said complex elements at a location between said edge of said longer side and said complex elements,
wherein said plurality of semiconductor chips are arranged along the longer-side direction of said case,
wherein said bonding wires are strung along the longer-side direction of said case,
wherein each said main electrode is disposed in a vicinity of one of sides extending in the longer-side direction of said case,
wherein each said main electrode and said circuit pattern are connected together by ultra-sonic bonding, soldering, or brazing,
wherein said case has a recessed portion on a top surface of said case, and
wherein each said main electrode has an edge extended from said recessed portion and bent at a bend location of said main electrode such that said edge extends from said bend location to a free end of said edge in an inward direction of said case toward said circuit pattern in a plan view in said recessed portion, and said free end of said edge overlaps said circuit pattern and said bend location is proximate to said longer side of said case.

2. The semiconductor device according to claim 1, wherein said circuit pattern is made of copper foil having a thickness of 0.4 mm or greater.

3. The semiconductor device according to claim 2, wherein in said two complex elements, said two of said plurality of semiconductor chips are connected in reverse parallel,
wherein said one of said two complex elements is configured such that said two of said plurality of semiconductor chips are connected in reverse parallel via said via-circuit pattern provided on the place interposed between said two of said plurality of semiconductor chips in a plan view, and
wherein said another one of said two complex elements is configured such that said two of said plurality of semiconductor chips are connected directly in reverse.

4. The semiconductor device according to claim 3, comprising a signal electrode provided within said case, said signal electrode being electrically connected to each of said plurality of semiconductor chips,
wherein said another one of said two complex elements includes an IGBT semiconductor chip and a diode chip, and
wherein said IGBT semiconductor chip has a driving potential reference connected to said circuit pattern or said signal electrode via said diode chip.

5. The semiconductor device according to claim 2, wherein said plurality of semiconductor chips include wide band gap semiconductors.

6. The semiconductor device according to claim 1, further comprising:
a plurality of signal electrodes provided within said case, said plurality of signal electrodes being electrically connected to said plurality of semiconductor chips; and
a signal terminal electrically connected to each of said signal electrodes,
wherein said signal electrodes are each disposed in a vicinity of a side extending in the shorter-side direction of said case,
wherein said signal terminal is disposed on one side of said outer frame extending in the shorter-side direction of said case, and
wherein a signal wire for connecting said each of signal electrodes and said signal terminal together passes near a first longer side, each of said signal electrodes being disposed in a vicinity of a first shorter side that is said side extending in the shorter-side direction of said case, said first shorter side being opposite said one side of said outer frame, where said signal terminal is disposed, said first longer side being another one of said sides extending in the longer-side direction of said case, said first longer side being opposite a second longer side that is said one of said sides extending in the longer-side direction of said case, where said main electrode is disposed.

7. The semiconductor device according to claim 1, wherein said plurality of semiconductor chips are arranged along the longer-side direction of said case, said plurality of semiconductor chips each being of a same kind, and
wherein an angle between a direction in which said plurality of semiconductor chips are arranged and a direction in which said bonding wires in said semiconductor chips are strung is within 20 degrees.

8. The semiconductor device according to claim 1, wherein one of said two of said plurality of semiconductor chips of said one of said two complex elements is an IGBT semiconductor chip, and an other of said two of said plurality of semiconductor chips of said one of said two complex elements is a diode chip, and an emitter of said IGBT semiconductor chip is connected to an anode of said diode chip by said plurality of the bonding wires via said via-circuit pattern.

* * * * *